United States Patent
Kanda et al.

(10) Patent No.: US 8,174,838 B2
(45) Date of Patent: May 8, 2012

(54) DISPLAY DEVICE ALLOWING REPEATED REMOVAL AND INSTALLATION OF SCREW

(75) Inventors: Atsushi Kanda, Tokushima (JP); Tsuzuki Takahashi, Tokushima (JP)

(73) Assignee: Nichia Corporation, Anan-shi (JP)

( * ) Notice: Subject to any disclaimer, the term of this patent is extended or adjusted under 35 U.S.C. 154(b) by 419 days.

(21) Appl. No.: 12/429,777

(22) Filed: Apr. 24, 2009

(65) Prior Publication Data

US 2009/0268416 A1 Oct. 29, 2009

(30) Foreign Application Priority Data

Apr. 25, 2008 (JP) ................................. 2008-116083

(51) Int. Cl.
*H05K 5/00* (2006.01)
*H05K 9/00* (2006.01)

(52) U.S. Cl. ........................................ 361/752; 361/818

(58) Field of Classification Search .................. 361/752, 361/818
See application file for complete search history.

(56) References Cited

U.S. PATENT DOCUMENTS

| | | | | | |
|---|---|---|---|---|---|
| 4,853,790 | A | * | 8/1989 | Dickie | 348/819 |
| 5,056,837 | A | * | 10/1991 | Fuehrer | 292/307 R |
| 5,285,007 | A | * | 2/1994 | Deluca et al. | 174/387 |
| 5,973,916 | A | * | 10/1999 | Han | 361/679.22 |
| 6,053,771 | A | * | 4/2000 | Hood et al. | 439/607.04 |
| 6,464,269 | B1 | * | 10/2002 | Wilhelm et al. | 292/307 R |
| 6,498,292 | B2 | * | 12/2002 | Holmberg et al. | 174/358 |
| 6,980,439 | B2 | * | 12/2005 | Schultz et al. | 361/753 |
| 7,055,932 | B2 | * | 6/2006 | Nakamura | 347/30 |
| 7,215,558 | B2 | * | 5/2007 | Schultz et al. | 361/816 |
| 7,269,026 | B2 | * | 9/2007 | Jeong | 361/760 |
| 7,609,531 | B2 | * | 10/2009 | Xia et al. | 361/816 |
| 7,618,018 | B2 | * | 11/2009 | Cardon | 251/129.15 |
| 7,878,561 | B2 | * | 2/2011 | Rietzler | 292/307 R |
| 2004/0027073 | A1 | * | 2/2004 | Nomoto et al. | 313/583 |
| 2006/0118747 | A1 | * | 6/2006 | Cardon | 251/129.15 |
| 2006/0133017 | A1 | * | 6/2006 | Bang | 361/681 |
| 2007/0182649 | A1 | * | 8/2007 | Kondou | 343/713 |
| 2007/0195512 | A1 | * | 8/2007 | Konno | 361/771 |
| 2008/0123317 | A1 | * | 5/2008 | Xia et al. | 361/818 |
| 2009/0033225 | A1 | * | 2/2009 | Kang | 313/583 |
| 2009/0121877 | A1 | * | 5/2009 | Henderson | 340/572.7 |

FOREIGN PATENT DOCUMENTS

| | | |
|---|---|---|
| JP | 09-331181 | 12/1997 |
| JP | 11-038905 | 2/1999 |
| JP | 2001-177154 A | 6/2001 |
| JP | 2001-242795 A | 9/2001 |

* cited by examiner

*Primary Examiner* — Lisa Lea Edmonds
*Assistant Examiner* — Xanthia C Cunningham
(74) *Attorney, Agent, or Firm* — Birch, Stewart, Kolasch & Birch, LLP (57) ABSTRACT

A display device includes a circuit board having a plurality of pixels arranged thereon, each pixel having a plurality of light emitting elements, a driving circuit driving the light emitting elements, a case housing the above, a frame having flanges at a circuit board side of the case to block external light toward the light emitting elements, and a shield disposed between the frame and the case to block electromagnetic noise. A screw is inserted into a through hole and placed into a screw receiving portion to fix the frame and the case. The screw receiving portion has a cylindrical metal portion housing the screw and electrically connecting the screw and the shield, and a resin portion interposed between the placed screw and the inner wall surface of the cylindrical metal portion.

18 Claims, 3 Drawing Sheets

DISPLAY DEVICE ALLOWING REPEATED REMOVAL AND INSTALLATION OF SCREW

BACKGROUND OF THE INVENTION

1. Field of the Invention

The present invention relates to a display device used in a large-screen luminescent display, and particularly to a display device capable of preventing adverse effect caused by electromagnetic noise from a driving circuit generated by on/off of light emitting elements.

2. Description of the Related Art

For example, a full-color large-screen luminescent display typically has a plurality of display units arranged next to each other, each display unit contains a plurality of pixels, where a combination of Red (R), green (G), and blue (B) light emitting diodes is defined as a pixel. Such a display unit is constructed as a combination of a display portion made up of light emitting diodes and a driving circuit for controlling the lighting of each light emitting diode. In the display portion, pixels, each of which is made up of a combination of the light emitting diodes which emit RGB lights respectively, are arranged in matrix, and the lead electrodes of the light emitting diodes are exposed from the back side of the circuit board. Circuit components such as IC, transistor, and a power connector are mounted on the circuit board having the driving circuit to control lighting of the light emitting diodes. A wiring pattern connected to the power connector is formed on the circuit board.

There have been known various measures for reducing adverse effect of electromagnetic noise originated in the circuit components due to on/off operations of the light emitting diodes and that originated in the entire wiring pattern connected to the power connector. In one example, a shielding member for preventing transmission of the electromagnetic noise is disposed to reduce the adverse effect of the electromagnetic noise.

For example, as described in JP 2007-177154A and JP 2001-242795A, as a measure to reduce adverse effect of electromagnetic noise, a shielding member is disposed between a frame and a frame mounting surface of the case, a screw is inserted into the through hole defined in the frame and is further placed into a screw receiving portion provided in the case to fix.

In this instance, the screw receiving portion is typically made of a metal material to secure sufficient fixing strength. The shielding member is electrically connected to the screw receiving portion, and is further connected to a grounding link provided to the case.

However, when the screw is placed into the screw receiving portion made of a metal material or the screw is taken out from the screw receiving portion, friction between the surfaces of the screw receiving portion and the screw may cause the surface of the metal to wear, resulting in deformation of the screw. Then, the screw becomes unable to fit tightly in the screw receiving portion and it raises concern about the fixing strength. For this reason, repeated screwing and unscrewing operations cannot be performed actively and it becomes difficult to replace the frame frequently.

To avoid such a problem, a screw having a structure capable of sustaining repeated screwing and unscrewing operations has also been proposed to use. For example, repeated screwing and unscrewing operations are possible with a so called metric screw thread. However, a metric screw thread has a structure to prevent loosening of a screw, and the loosening preventing structure results in high screw head. As described above, when the height of the screw head is increased, light from the light emitting elements may be blocked by the screw head which may cause reduction in display quality of the display device. Meanwhile, a screw which is designed specifically for a resin (for example, a tapping screw) and which is capable of sustaining repeated screwing and unscrewing operations with respect to a member made of resin material, is commonly used. If the material of the screw receiving portion is made of a resin to allow such a tapping screw to be threaded therein, an electric connection between the screw receiving portion and the shielding member cannot be established because a resin is an insulating material. Therefore, instead of establishing an electric connection with a shielding member at the screw receiving portion, there raises a need to separately provide an electrical connection part between the shielding member and the grounding link of the case.

Therefore, an object of the present invention is to provide a display device which includes together with a frame, a shielding member is fixed to a case through a screw, the device is capable of sustaining repeated screwing and unscrewing operation while maintaining an electric connection between the shielding member and a screw receiving portion for the screw to be screwed in.

SUMMARY OF THE INVENTION

In order to accomplish the above objects a display device according to the present invention includes a circuit board having a plurality of pixels arranged thereon, each pixel being made up of a plurality of light emitting elements, a driving circuit to drive the light emitting elements, a case to arrange the above, a frame having one or more flanges disposed on the case at a circuit board side of the case to block external light to the light emitting elements, and a shield disposed between the frame and the case to block electric noise. A screw is inserted into a through hole and placed into a screw receiving portion to fix the frame and the case. Further, the screw receiving portion has a cylindrical metal portion and a resin portion. The cylindrical metal portion accommodates the screw and also electrically connects the screw and the shield, and the resin portion is interposed between the placed screw and the inner wall surface of the cylindrical metal portion.

Moreover, it is preferable that the metal portion has a cut-out portion extending from the inner wall surface to the side surface, and the resin portion and the case are connected through the cut-out portion by a resin which forms the resin portion and the case.

It is preferable that the side surface of the metal portion has a projection, and the projection and the resin portion forming the case fit each other with their recess-projection engagement.

The top of the metal portion preferably extends further than the top of the resin portion of the screw receiving portion or the resin portion forming the case.

It is preferable that the metal portion is electrically connected to an electrode provided on a housing supporting the display device.

The screw receiving portion according to the present invention includes a cylindrical metal portion electrically connecting to a shield provided to the display device and a resin portion interposing between a screw and the inner wall surface of the cylindrical metal portion. With this construction, a tapping screw which allows repeated screwing and unscrewing operations can be used, while maintaining the electric connection between the shield and the screw receiving portion. Further, using of a tapping screw allows frequent replacements of the frame without dismounting the display device from a device mounting member (housing) when repairing the display device. Accordingly, a reduction in energy, time, and cost for the replacement can be achieved.

In addition, a tapping screw is provided with a locking function and is not equipped with a washer or the like for a locking function as used in a metric screw. The screw head therefore does not project too much, so that the display quality of the display device would not be reduced. Further, the shielding member can be fixed at the same position as that of the frame and the case, so that the structure of the display device can be simplified.

The above and further objects of the present invention as well as the features thereof will become more apparent from the following detailed description to be made in conjunction with the accompanying drawings.

DETAILED DESCRIPTION OF THE EMBODIMENT(S)

Figure 1:
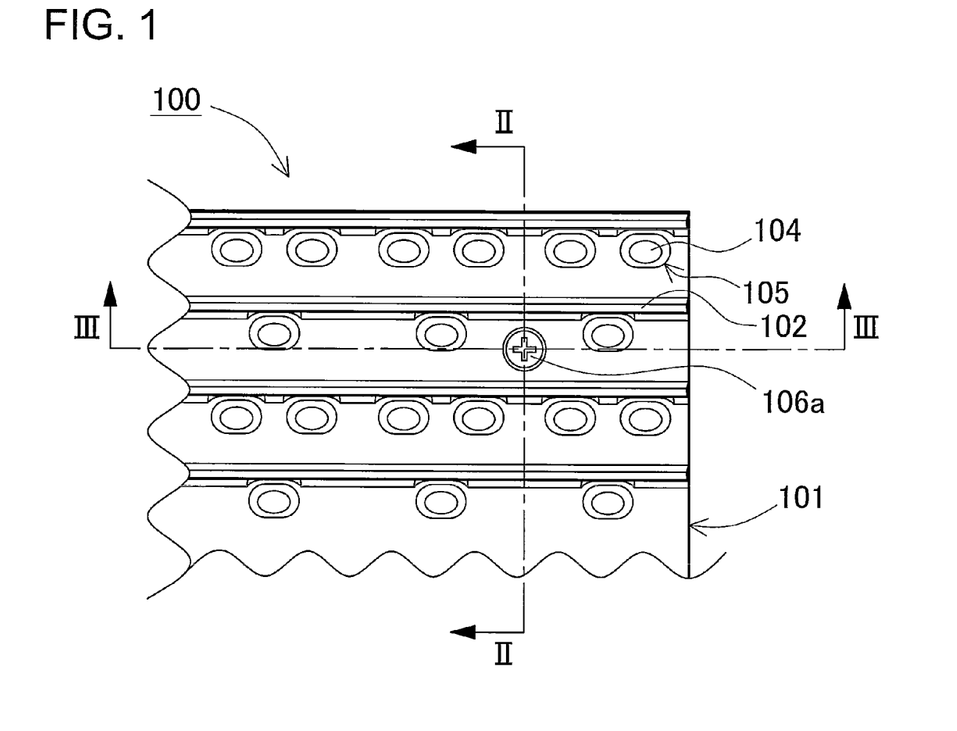
FIG. 1 is a partial front view of a display device according to an example of the present invention.
Figure 2:
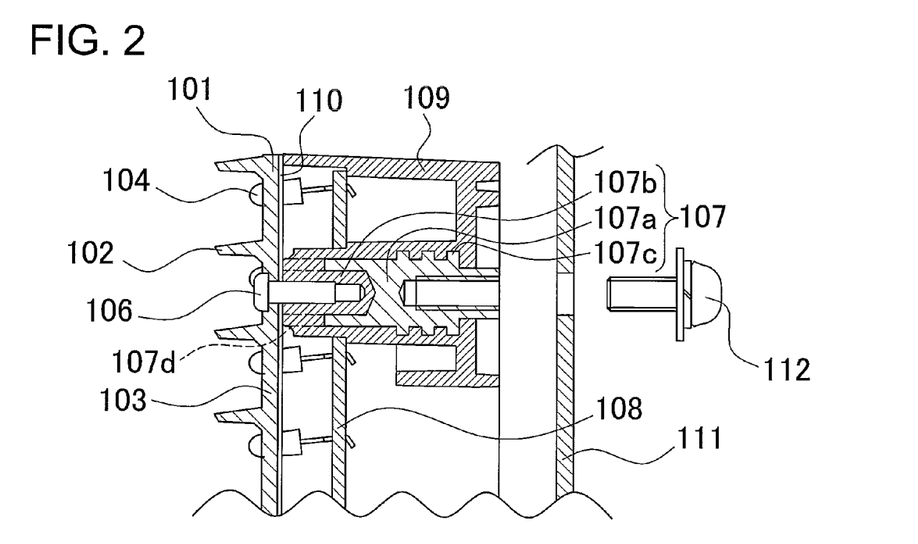
FIG. 2 is a cross sectional view in II-II direction of a display device shown in FIG. 1.
Figure 3:
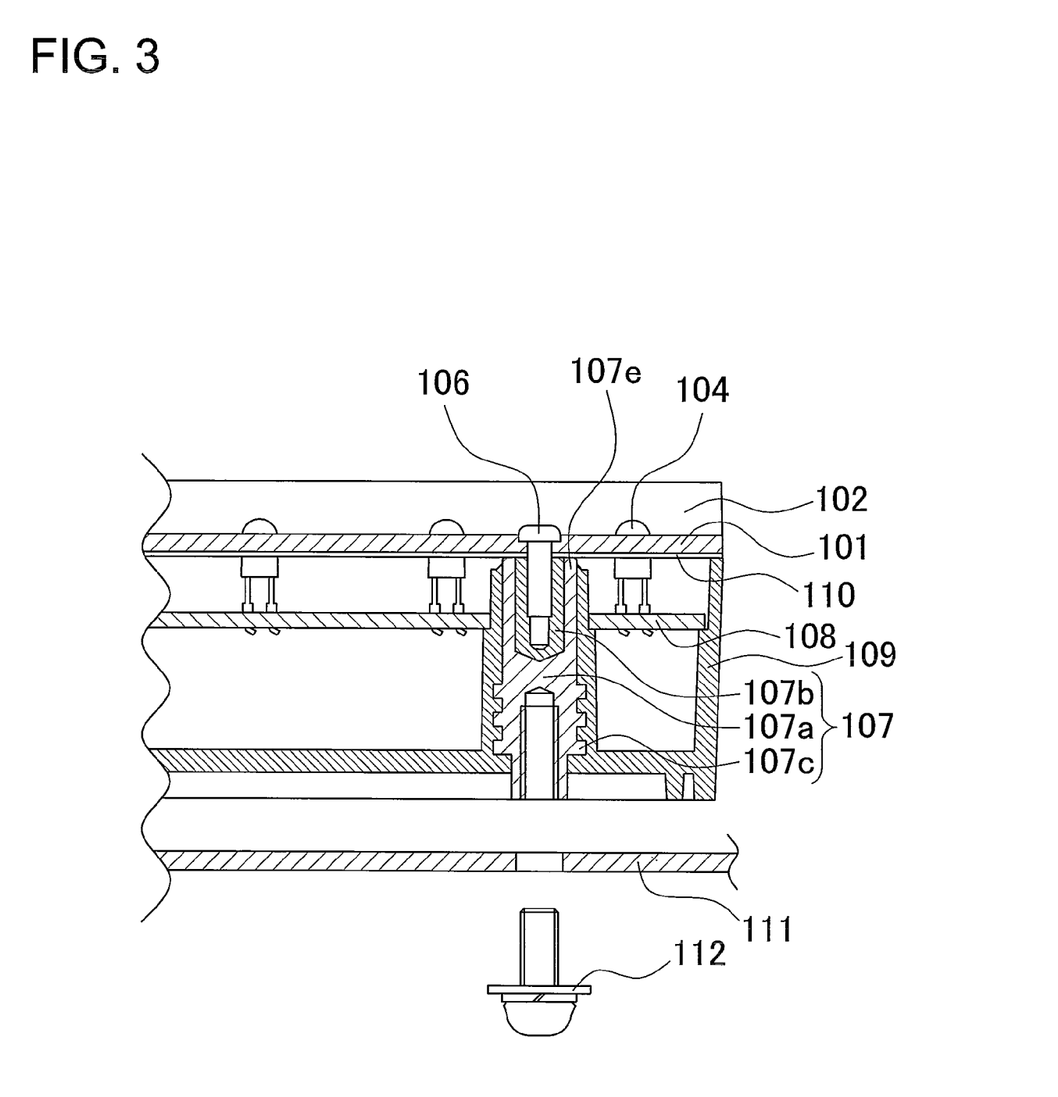
FIG. 3 is a cross sectional view in III-III direction of a display device shown in FIG. 1.
Figure 4:
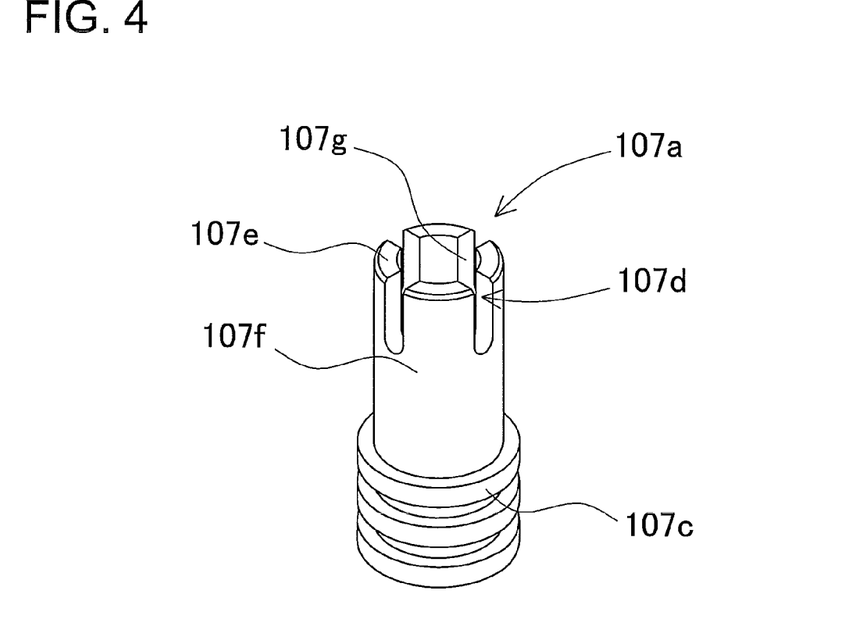
FIG. 4 is a perspective view of a metal portion in the display device shown in FIG. 1.

FIG. 1 is a partial front view of a display device 100 according to the present embodiment. FIG. 2 is a cross sectional view in II-II direction of a display device 100 shown in FIG. 1. FIG. 3 is a cross sectional view in III-III direction of a display device 100 shown in FIG. 1. FIG. 4 is a perspective view of a metal portion 107a in the display device 100 shown in FIG. 1.

The present invention concerns a display device 100 including a circuit board 108 on which pixels, each formed by a plurality of light emitting elements 104, arranged in matrix, a driving circuit (not shown) to control emission and non-emission of the light emitting elements 104, a case 109 accommodating them, a frame 101 arranged to the case at a side where the light emitting elements 104 are arranged and has one or more flanges 102 preventing external light from entering the light emitting elements 104, and a shield 110 disposed between the frame 101 and the case 109 to block an electromagnetic noise. Further, in the display device 100, the frame 101 and the case 109 are fixed by a screw 106 which is inserted in a through hole defined in the frame 101 and which is placed to a screw receiving portion 107 provided to the case 109.

The present inventors conducted various studies on such a device 100, in order to enable repeated screwing and unscrewing operations while maintaining the electric connection between the screw receiving portion 107 for placing the screw 106 and the shield 110.

As a result, the present inventors solved the above problems by forming a screw receiving portion 107 with a cylindrical metal portion 107a electrically connected to a shield 110 and a resin portion 107b interposed between a placed screw 106 and an inner wall surface 107g of the cylindrical metal portion 107a. In this arrangement, the inner wall surface 107g of the cylindrical metal portion 107a defines a space capable of accommodating the resin portion 107b and the body (portion with a helical ridge or thread formed thereon) of the screw. Moreover, as shown in FIG. 2, FIG. 3, and FIG. 4, the resin portion 107b forming the screw receiving portion 107 is interposed between the body of the screw 106 and the inner wall surface 107g of the cylindrical metal portion 107a.

In the present invention, a part of the screw receiving portion 107 is made of a resin material and a metal material, so that a tapping screw which allows repeated screwing and unscrewing operations can be used while maintaining the electric connection between the shield and the screw receiving portion 107 in which a screw is placed. The shield 110 which is a component of the present invention can be such that a part of the frame 101 at the side to be attached to the case is made of a conductive material and used as a shielding portion, or a sheet-shaped shielding member is arranged between the case 109 and the frame 101.

FIG. 2 is a cross sectional view in a vertical direction, showing a metal portion 107a including a cut-out portion 107d. The metal portion 107a which is a component of the screw receiving portion 107 is, as shown in FIG. 4, a cylindrical metal member having a cut-out portion 107d defined from the inner wall surface 107g through the side surface 107f. Further, as shown in FIG. 2, it is preferable that the resin portion 107b disposed to the inner wall 107g side of the metal portion 107a of the screw receiving portion 107 and the resin portion forming the case 109 are connected by the resin which is the constituent thereof through the cut-out portion 107d. Although it is not specifically shown in the figures, a through hole from the inner wall surface 107g to the side surface 107f may be defined in the metal portion 107a, instead of defining a cut-out portion 107d by making a cut in a top of the metal portion 107a.

As shown in FIG. 4, the cut-out portion 107d may be defined such that a part of the metal portion 107a is cut out from the top 107e side of the metal portion 107a which is electrically in contact with the shield 110, to the lower end side (the side where a protrusion 107c is formed) of the metal portion 107a.

The through hole in the metal portion can be defined as a hole extended from the side surface of the metal portion to the inner wall surface. In a case where the through hole is provided, compared to a case where a cut-out portion 107d as described above is provided, the area of the top 107e of the metal portion 107a which is electrically connected with the shield 110 will not be reduced. Therefore, the area of the top of the metal portion 107a which electrically connects the metal portion 107a and the shield 110 is sufficiently secured. With this arrangement, failure in the electric connection between the shield 110 and the top 107e of the metal portion 107a can be reduced, so that the electromagnetic noise can be removed to the outside of the display device, and the display device with high reliability can be obtained.

The structure in which the resin portion 107b of the screw receiving portion 107 and resin forming the body of the case 109 are connected can be easily obtained by forming the case 109 by way of injection molding using a resin so that the cylindrical metal portion 107a defining the through hole or a cut-out portion 107d is embedded in the body of the case 109. That is, the molding resin is extended from outside to the inner wall surface of the cylindrical metal portion through the through hole or the cut-out portion, so that the resin portion of the screw receiving portion and the resin forming the body of the case can be connected.

Thus, the structure is formed such that the resin portion of the inner side of the metal portion and the resin portion forming the case outside of the metal portion are connected by the resin which is the constituent material thereof. With this arrangement, the resin portion disposed to the inner wall of the cylindrical metal portion can be prevented from detaching from the screw receiving portion which may occur accompanying the rotation of the screw in the resin portion during repeated screwing and unscrewing operations.

A display device according to the present invention preferably has a structure in which a side surface 107f of the metal portion 107a has a protrusion 107c and the protrusion 107c and the resin portion 107b which is a component of the case fit each other with their recess-projection engagement. Such a structure can be obtained, for example, by embedding the metal portion 107a having a protrusion 107c on its side surface 107f into the resin material forming the body of the case, and covering the entire surface of the projection 107c with the resin material, when forming the case 109 as shown in FIG. 2 by way of injection molding. With this arrangement, in a structure in which the metal portion 107a and the case 109 are combined, a recess-projection shape which fit with the projection-recess shape made by the projection 107c of the metal portion 107a can be formed easily on the case 109 side. Alternatively, the contacting surface with the metal portion 107a of the case 109 is pre-made with a shape which can fit with the recess-projection shape made by the projection 107c of the metal portion 107a so that the metal portion 107a can be engaged in the case 109. For example, a thread may be formed on the side surface of the metal portion to make the metal portion as a male thread and placed in the female screw provided on the case.

With this structure, an anchor effect can be obtained between the projection at a side surface of the metal portion and the resin portion constructing the case, so that the metal portion can be fixed firmly to the body of the case. Accordingly, detachment of the metal portion from the screw receiving portion during repeated screwing and unscrewing can be prevented and the display device having high reliability can be obtained.

Figure 5:
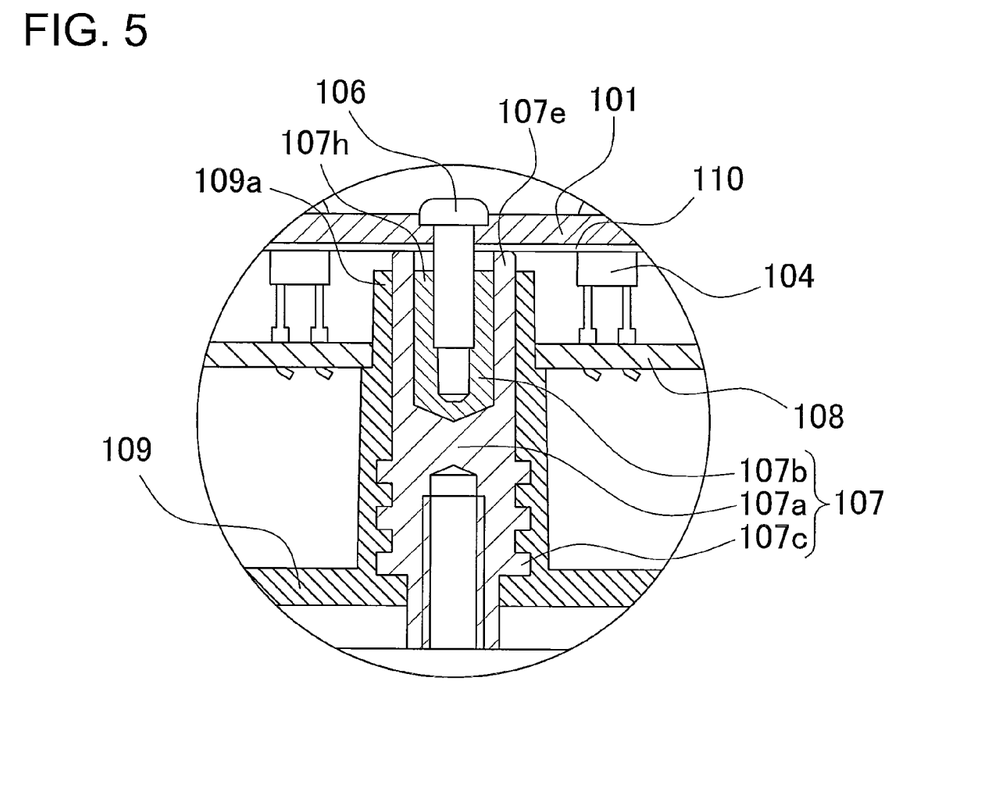
FIG. 5 is a partially enlarged cross-sectional view of a display device according to another example of the present invention.

The metal portion constructing the screw receiving portion is preferably such that the top of the metal portion which is electrically connected to the shield protrudes further than the top of the resin portion disposed on the inner surface of the cylindrical metal portion or the top of the resin portion constructing the case arranged outside of the metal portion. If adequate electric connection with the shield can be obtained at the metal portion, the top of the metal portion can be arranged protruding from at least one of the top of the resin portion disposed to the inner wall surface of the cylindrical metal portion or the top of the resin portion constructing the case arranged outside of the metal portion. FIG. 5 is a partially enlarged cross-sectional view of a display device according to another example of the present invention. For example, as shown in FIG. 5, in the metal portion 107a constructing the screw receiving portion 107, the top 107e electrically connecting to the shield 110 protrudes further to the shield 110 than to the top 107h of the resin portion 107b disposed on the inner wall surface of the metal portion 107a or to the top 109a of the resin portion constructing the case 109 arranged outside of the metal portion 107a.

With this arrangement, a display device according to the present invention is capable of maintaining good electric connection between the top 107e of the metal portion 107a and the shield 110, compared with the arrangement in which the resin portion further protrudes than the top of the metal portion. Accordingly, the effect of removing the electromagnetic noise can be secured.

According to the present invention, the metal portion in the screw receiving portion and the ground electrode provided to the housing to which the display device to be attached are preferably electrically connected by the wiring applied on the display device. With this arrangement, electromagnetic noise can be securely removed to outside of the display device, so that a display device with high reliability can be obtained. Each component of the display device of the present embodiment will be described in detail below.

(Light Emitting Element)

A light emitting diode and a laser diode can be used as the light emitting element in the present embodiment. In a light emitting diode which is suitably used, a light emitting chip is arranged on a lead electrode or a package and electrically connected with a lead electrode, then, covered with a translucent member using a resin or glass.

In a suitably used light emitting diode chip, a semiconductor such as ZnS, SiC, GaN, GaP, InN, AlN, ZnSe, GaAsP, GaAlAs, InGaN, GaAlN, AlInGaP, or AlInGaN is grown as a light emitting layer on a circuit board by way of liquid phase deposition, HDVPE, or MOCVD. From ultraviolet light to infrared light, various wavelengths of emission can be selected according to the materials and the mixed crystal ratio of the semiconductor layer.

Particularly, in a case where a display device is made for outside use, a light emitting element capable of emitting light with high intensity is required. Therefore, for the material for a light emitting element capable of emitting high intensity emission in green or blue region, a nitride gallium compound semiconductor is preferably selected. For the material for a red light emitting element, a gallium-aluminum-arsenide semiconductor or an aluminum-indium-gallium-phosphide semiconductor is preferably selected. In addition, a light emitting diode in which a nitride-based compound semiconductor is combined with phosphors which are excited by the emission wavelength of the nitride-based compound semiconductor and emit various emission colors can also be used.

In order to form a color display device, it is preferable to use a combination of the light emitting diode chips respectively emit a red light having a wavelength of 610 nm to 700 nm, a green light having a wavelength of 495 nm to 565 nm, and a blue light having a wavelength of 430 nm to 490 nm.

A light emitting diode chip is electrically connected with a lead electrode which supplies electric power to the light emitting diode chip, and covered with a sealing member which protect the light emitting diode chip from outside. A transparent resin such as an epoxy resin, a urea resin, or a silicone resin is suitably used as the material for the sealing member.

The viewing angle of the light emitting diode can be increased by including a diffusing agent in the sealing member. Barium titanate, titanium oxide, aluminum oxide, silicon oxide, or the like is suitably used as the diffusing agent. Further, emission from the light emitting diode can be either focused or diffused by forming the sealing member in a lens shape. Examples of such a shape include an ellipse shape, a convex-lens shape, a concave-lens shape, or a combination of such shapes, each of which is to increase the viewing angle in a horizontal direction. Further, a pigment or a dye may be included in the sealing member as a coloring agent to block a certain wavelength.

(Case)

A case is a member to dispose a circuit board having the light emitting elements arranged in matrix and a driving circuit, and to protect them from external environment. The case may be formed in a box-shape having a shape and size capable of accommodating the circuit board on which the light emitting elements have been arranged and the driving circuit. In view of easiness of injection molding and mechanical strength, the material of the case is preferably polycarbonate resin, ABS resin, epoxy resin, phenol resin, or the like. Particularly, a polycarbonate resin containing a black pigment to improve the contrast is suitably used.

As shown in FIG. 2 and FIG. 3, the case 109 of the present embodiment has a screw receiving portion 107 to which a screw 106 for fixing the frame 101 and the case 109 is screwed in, at the side to which the frame 101 to be disposed. The screw receiving portion 107 has a cylindrical metal portion 107a and a resin portion 107b disposed on the inner wall surface 107g of the cylindrical metal portion 107a. In this embodiment, as shown in FIG. 4, the metal portion 107a is made of a cylindrical metal material and has an top 107e electrically connected to the shield 110 and an inner wall surface 107g defining a space of a size and shape sufficient to accommodate at least the body (portion with a helical ridge or thread formed thereon) of the screw 106. The resin portion 107b is a member disposed on the inner wall surface 107g of the metal portion 107a and made of a resin material which is interposed between the body of the screw 106 and the inner wall surface 107g of the metal portion 107a when the screw 106 is placed into the screw receiving portion 107. Such a screw receiving portion 107 can be formed such that when the case is formed by way of injection molding using a resin as a material, the metal portion 107a is embedded in the resin material and the resin material is extended from the outside of the metal portion 107a to the inner wall surface 107g of the metal portion 107a. At this time, a cut-out portion 107d or a through hole extending from the side surface 107f to the inner wall surface 107g of the metal portion 107a may be provided to make the resin material easier to extend and stay on the inner wall surface 107g of the metal portion 107a. Moreover, as described above, the resin portion 107b in the screw receiving portion 107 and the resin material forming the case body 109 disposed outside of the screw receiving portion can be firmly connected by providing such a through hole or cut-out portion 107d in the metal portion 107a. Therefore, the resin portion 107b can be prevented from detaching from the screw receiving portion 107 during screwing and unscrewing operations.

In an example of method of forming the screw receiving portion in the case, a body of the case, a cylindrical metal portion, and a resin portion to be fit in the inner wall of the cylindrical metal portion are formed separately and then fitted together and assembled. According to such a forming method, the resin portion to be fit in the metal portion can be formed either with the same material used for the case or with a different material. For example, the case and the resin portion can be formed by using either the same or different materials selected from polycarbonate resin, ABS resin, epoxy resin, and phenol resin. Further, if the contact surface between the cylindrical metal portion and the resin portion to be fitted in the inner wall of the cylindrical metal portion is provided with a recess-projection shape with which the both portions can be engaged with each other, the both portions can be fixed at an accurate position. Alternatively, it is possible to form the screw receiving portion in such a way that the resin portion is formed beforehand at the portion to which the screw receiving portion of the case to be formed, and the cylindrical metal portion is engaged to the outside of the resin portion so that the resin portion is disposed on the inner wall surface of the cylindrical metal portion.

Examples of the main material for the metal portion 107a which is a component of the screw receiving portion 107 include at least one selected from brass, aluminum, copper, iron, and the like. Brass is suitably used. In addition, metal plating such as silver plating, gold plating, aluminum plating and the like can be applied to the surface. With this arrangement, a good electric connection with the surface of the shield can be obtained.

(Circuit Board)

The circuit board of the present embodiment has light emitting elements arranged thereon and conductor wirings supplying electric power to the respective light emitting elements. The light emitting elements are electrically and mechanically connected to the circuit board with respective lead electrodes by a conductive member such as a solder or a conductive paste. The material of the circuit board preferably has a high mechanical strength and a small thermal deformation. Specifically, a printed circuit board using such as ceramics, glass, or aluminum alloy can be suitably used. A surface of the circuit board to which the light emitting elements to be mounted is also the display surface of the display device, so that it is preferable that the surface is colored with a darker color to improve the contrast.

The driving circuit to be described later can be mounted on the same circuit board with the light emitting elements. Alternatively, the circuit board on which the light emitting elements to be arranged and the circuit board on which the driving circuit to be described later to be mounted can be provided as different circuit boards. In a case where the driving circuit is mounted on the same circuit board as the light emitting elements, the circuit portion can be mounted on the main surface on which the light emitting elements have been arranged or on the main surface opposite from the surface on which the light emitting elements have been arranged.

(Frame)

As shown in FIG. 1 and FIG. 2, the frame 101 of the present embodiment is a plate-like member as a whole shape, and is attached to the case 109 so that the frame is on the display surface side of the display device 100. The frame 101 is a member to cover the circuit board 108 and the driving circuit, which are disposed on the case 109 from the surface side of the display device, 100 and protect them from external environment. Further, the frame 101 has the openings to arrange the light emitting elements 104 and the one or more flanges 102 to block external light from obliquely above to enter the upper surface 103 of the display device 100. The frame 101 defines a through hole at the base of a flange 102 attached to the body of the frame, the through hole is extended from the display surface side of the display device 100 to the back surface side thereof facing the case 109. A screw 106 is inserted into the through hole and is placed in the screw receiving portion 107 provided in the case 109. The through hole of the frame 101 is defined by a shape and size with which the resin portion 107b of the screw receiving portion 107 is exposed from the through hole when the frame 101 is disposed in the case 109.

The flanges 102 can be attached to the upper surface 103 of the frame 101 at a predetermined angle with respect to the upper surface 103 of the frame 101 according to the installation site of the display device 100. That is, in view of improving the contrast in the display surface of the display device, the reflected light from the upper surface 103 of the frame toward an observer is needed to be prevented. For this reason, the flanges 102 are attached at a certain angle with respect to the upper surface 103 of the frame 101 so that external light coming from obliquely above the upper surface 103 of the frame 101 can be blocked. Further, it is preferable that the angle thereof is appropriately adjusted to improve the display quality according to the place where the display device 100 to be used and the solar altitude at the time and the positions of the observer.

Examples of suitable material for the frame 101 include polycarbonate resin, ABS resin, epoxy resin, phenol resin, and aluminum, copper, and an alloy thereof containing one or more of other metals such as Mg, Si, and Fe. Particularly, a polycarbonate containing glass fiber is preferable because it has excellent mechanical strength and a frame having weather resistance can be easily formed. Moreover, a frame made of a resin can be darkly colored such as in a blackish color by containing a colorant. With a frame made of a metal material, the contrast can be improved by applying a darkish coating material on the metal surface thereof.

The frame 101 may have minute recess-projection configuration in the surface of the flanges 102 or in the upper surface 103 extending outside of the openings in which the respective light emitting elements 104 to be arranged. With such minute recess-projection configuration, contrast reduction due to reflected external light toward the observer can be prevented. The minute recess-projection configuration can be formed by, for example, applying sandblast treatment on the surface of the frame 101 or applying a coating material containing microparticles on the surface of the frame 101. The minute recess-projection configuration is preferably such that, according to JIS B0601, the arithmetic average (Ra) is preferably in a range between 1 to 50 µm, more preferably between 2 to 10 µm, with the condition of the cutoff value ($\lambda c$) of the roughness curve being 0.8 mm, the reference length of the roughness curve being 2.40 mm. In addition, the ten points average roughness (Rz) is preferably in a range between 5 to 100 µm, more preferably between 10 to 50 µm.

In an embodiment of the present invention which is different than the present embodiment, the back surface of frame which is the opposite side from the display surface of the display device can have a portion for blocking electromagnetic noise originated from the electronic circuit which is attached to the driving circuit. That is, a shield portion having an effect of blocking the electromagnetic noise can be disposed on the frame without interposing a shielding member between the frame and the case, by applying a conductive coating material or applying plating on the back surface of the frame. With this arrangement, the structure of the display device can be simplified compared with the structure in which the shielding member and the frame are provided separately. Examples of the main material contained in the electrically conductive coating and the materials used in plating include silver, copper, nickel, and the like. The shape and size of the shield portion is adjusted so as to cover the portions in the display device which generate electromagnetic noise. The thickness of the electrically conductive coating or resin plating is appropriately adjusted to block the electromagnetic noise generated in the driving circuit or wiring pattern.

(Shielding Member)

A display device of the present embodiment has a shielding member 110 between the back surface of the frame 101 and the frame-attaching surface of the case 109 in order to block the electromagnetic noise from the driving circuit and the wiring pattern. The shielding member 110 is formed with a material having an effect to reduce (shielding effect) the transmission of electromagnetic noise. Examples of the material having shielding effect include carbon, aluminum, and copper. In view of improvement of the shielding effect and easiness of manufacturing, a shielding member made of aluminum formed into a sheet-shape is suitably used. The shape and size of the shielding member is adjusted so as to cover the portions in the display device which generate electromagnetic noise. The thickness of the shielding member is appropriately adjusted so that the electromagnetic noise generated in the driving circuit or wiring pattern can be blocked by the shielding member.

The shielding member 110 defines a through hole penetrating from the front surface to the back surface to install a screw 106. The screw 106 is inserted in the through hole and the surface of the shielding member 110 and the top 107e of the metal portion 107a of the screw receiving portion 107 are electrically connected, then, the shielding member 110 is fixed between the frame 101 and the case 109. The mechanical connection between the frame 101 and the case 109 is provided by placing the screw 106 in the screw receiving portion 107. Therefore, the contact strength between the shielding member 110 and the metal portion 107a can be adjusted by adjusting the tightness of the screw. That is, as the screw is held tightly in place, the shielding member 110 arranged between the frame 101 and the case 109 is compressed firmly against the top 107e of the metal portion 107a of the screw receiving portion 107. With this arrangement, poor electric connection between the shielding member 110 and the metal portion 107e of the screw receiving portion 107 can be prevented.

Further, electrically connecting the shielding member to a grounding link (not shown) allows releasing electromagnetic noise from the shielding member to the ground electrode terminal of the case, so that greater shielding effect can be obtained.

(Driving Circuit)

A driving circuit (not shown) of the present embodiment is formed of a circuit element which applies voltage to the light emitting elements to control ON/OFF operations of the light emitting elements.

More specifically, in a display device of dynamic driving system, the light emitting elements arranged in matrix are driven by an output pulse from the driving circuit. Such a driving circuit can be constructed by a storage means temporarily storing inputted display data, a tone control circuit operating tone signals to turn the light emitting elements on at a predetermined time based on the data stored in the storage means, and a driver which turns the light emitting elements on according to the output signal from the tone control circuit. For example, the light emitting elements are turned on when the driver is on, and the light emitting elements are turned off when the driver is off. Controlling the duration of lighting of each light emitting element enables a desired image data to be displayed. Also, an image data can be inputted to the circuit by the central processing unit.

The following description will describe examples according to the present invention with reference to the drawings. However, it is needless to say that the present invention is not limited only to the examples described below.

Example 1

FIG. 1 is a partially view of a display device 100 according to the present example. FIG. 2 is a cross sectional view in II-II direction of a display device 100 shown in FIG. 1. FIG. 3 is a cross sectional view in III-III direction of a display device 100 shown in FIG. 1. FIG. 4 is a perspective view of a metal portion 107a in the display device 100 shown in FIG. 1.

A display device 100 according to the present example includes a circuit board 108 to which light emitting diodes 104 are electrically and mechanically connected, a driving circuit (not shown) disposed on the circuit board 108 and configured to drive the light emitting diodes 104, a case 109 to which the circuit board 108 and the driving circuit are disposed, a frame 101, and a shielding member 110 disposed between the frame 101 and the case 109 to block electromagnetic noise.

The case 109 is formed by injection molding using a polycarbonate resin containing a black pigment, into a shape and size capable of disposing the circuit board and the frame, in which the circuit board has the light emitting elements 104 and the driving circuit disposed thereon. The case 109 has a screw receiving portion 107 to fix the case 109 and the frame 101 and to place the screw 106, with the shielding member having a sheet-like shape made of aluminum 110 being interposed between the frame 101 and the case. The screw receiving portion 107 is mainly made of brass and constructed with a hollow cylindrical metal portion 107a and a resin portion 107b made of resin and disposed on the inner wall surface of the metal portion 107a. The metal portion 107a includes a top 107e being in contact with the surface of the shielding member and a cut-out portion 107d defined in a chiseled shape in a part of a side surface downwardly from the top 107e. A part of the resin portion 107b is extended from the inner wall surface 107g to the side surface 107f of the metal portion 107a through the cut-out portion 107d and connected with a part of the resin material forming the case 109. Such a screw receiving portion 107 can be formed simultaneously when the case 109 is formed by injection molding so that the metal portion 107a is embedded in the body of the case 109. That is, the resin material forming the body of the case 109 is introduced through the cut-out portion 107d defined in the metal portion 107a to the inner wall surface 107g of the cylindrical metal portion 107a, and then cured. Thus, the metal portion 107a is embedded in the resin portion forming the case 109, and further, the resin portion 107b is formed on the inside of the cylindrical metal portion 107a. On the side surface 107f of the cylindrical metal portion 107a, a plurality of circular protrusions 107c, each of which circles around the side surface 107f, are formed with an interval. The resin material forming the case 109 is applied to cover the surface having a recess-projection shape formed by the protrusions 107C and then it is cured. Moreover, through the use of resin shrinkage in molding the resin portion 107b, the top of the resin portion 107b is made lower then the top of the metal portion 107a which is in contact with the surface of the shielding member 110.

The frame 101 defines a through hole to insert a screw 106 to fix the frame 101 with the case 109 therethrough. Further, the frame 101 defines openings 105 of a size capable of exposing the light emitting surface of the respective light emitting diodes 104 and has a plurality of flanges 102. The frame 101 is formed by injection molding of a polycarbonate resin containing a black pigment such that the flanges 102 arranged at the side facing the display surface of the display device 100, the openings 105 to expose the light emitting surface of the respective light emitting diodes 104, and the through hole to insert the screw 106 therethrough are formed integrally with the body of the frame 101.

In this arrangement, each of the openings 105 is defined in the frame 101 so that the upper surface 103 of the frame 101 is located at the base of the flanges 102, to house the light emitting diode 104 in the opening respectively. Further, the upper surface 103 of the frame 101 has microscopic roughness obtained by mat finishing.

Also, as viewed from the display surface of the display device 100, each of the flanges 102 is arranged extending in the row direction (that is, a horizontal direction when the display device 100 is installed to a housing) of the pixels arranged in matrix. Further, the surface 103 of each flange 102 has microscopic roughness obtained by mat finishing.

In this example, the semiconductor in the light emitting layers used in the light emitting diode chips 104 respectively capable of emitting green, blue, and red light are InGaN (main wavelength of 525 nm), InGaN (main wavelength of 470 nm), and AlGaInP (main wavelength of 660 nm). Each chip is die-bonded to the read frame by epoxy resin or Ag paste and then wire-bonded by a gold wire to electrically connect the chip and the read frame. Further, as a sealing member, an epoxy resin is applied to cover each chip, so as to form a sealing member having an approximately oval shape when viewed from the top of the sealing member. As described above, the light emitting diodes 104 capable of emitting green, blue, or red light respectively, are formed.

One pixel in the present example is made of one red, one green, and one blue light emitting diodes 104, and when viewed from the display surface side of the display device 100, the arrangement pattern of each light emitting diode is in reverse triangle. As shown in FIG. 1, one pixel in the present example is constructed by two light emitting diodes arranged above and one light emitting diode arranged below with respect to the flange 102 interposed therebetween. Further, on the circuit board 108, a plurality of pixels are arranged in matrix and the conductive pattern of the circuit board 108 and the read frames of the light emitting diodes are soldered thereto. The light emitting diodes each having a sealing member with an oval cross-sectional shape are arranged on the circuit board 108 so that the long axis of the ovals are in parallel with the horizontal direction of the display device. Also, the light emitting diodes are arranged at about 6 degrees of tilt with respect to the perpendicular line of the circuit board 108. In order to insert the sealing member portions of each light emitting diode, a plurality of openings 105 are defined in the frame 101 at positions such that among the three light emitting diodes constructing one pixel, two light emitting diodes are arranged above a flange 102 and the rest of the one light emitting diode is arranged below the flange 102.

The frame 101 is attached to the case 109 so that the light emitting diodes 104 arranged on the circuit board 108 are respectively positioned inside the openings 105. The positions of the through hole defined in the shielding member 110 and the screw receiving portion 107 are adjusted so that the resin portion 107b of the screw receiving portion 107 of the case 109 is exposed from the through hole defined in the frame 101, and then, the frame 101 is disposed to the case 109. Further, the shielding member 110 is interposed between the frame 101 and the case 109 and the tapping screw (screw 106) is placed into the resin portion 107b to fix the frame 101 and the case 109, with the surface of the shielding member 110 and the top of the metal portion 107a constructing the screw receiving portion 107 being in contact with each other.

Moreover, as shown in FIG. 2, the display device according to the present example is fixed to the housing 111 installed at the mounting location of the display device 100 by a fixing member 112 such as a screw or pin through the screw receiving portion 107 disposed extending to the back of the case 109. The fixing member 112 according to the present example is a different screw than the screw described above, and is placed to the screw receiving portion disposed at the back side of the display device to the metal portion 107a which is the same portion constructing the screw receiving portion 107 to which the screw 106 has been placed. The screw receiving portion 107 which is provided in the same metal portion 107a is shared by placing the screw 106 at the surface side and placing the fixing member 112 at the back side of the display device 100, so that the structure of the display device 100 can be simplified.

The display device according to the present example as a unit, a large-sized color display can be assembled by installing a plurality of units to a housing. The case 109 has a ground electrode terminal (not shown) electrically connected with the shielding member 110 at the back side (mounting surface side to the housing) of the case, and the ground electrode terminal is electrically connected to the grounding terminal provided on the housing 111.

Example 2

FIG. 5 is a partially enlarged cross-sectional view of a display device according to an example according to the present example. A display device according to the present example has a structure in which, as shown in FIG. 5, in the metal portion 107a constructing the screw receiving portion 107, the top 107e electrically connecting to the shield 110 protrudes further to the shield 110 than to the top 107h of the resin portion 107b disposed on the inner wall surface of the metal portion 107a or to the top 109a of the resin portion constructing the case 109 arranged outside of the metal portion 107a. A display device is constructed in a similar manner as in Example 1, except that the case 9 is formed by way of injection molding.

INDUSTRIAL APPLICABILITY

The present invention is applicable as a display device having a plurality of light emitting elements arranged in matrix to display color images, and particularly as a color display capable of obtaining clear images with high contrast even in outdoors.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2008-116083 filed in Japan on Apr. 25, 2008, the content of which is incorporated herein by reference.

DENOTATION OF REFERENCE NUMERALS

100: display device
101: frame
102: flange
103: upper surface of frame
104: light emitting element
105: opening
106: screw
107: screw receiving portion
107a: metal portion
107b: resin portion
107c: projection
107d: cut out portion
107e: top of metal portion
107f: side surface of metal portion
107g: inner wall surface of metal portion
108: circuit board
109: case
110: shield
111: housing
112: fixing member

What is claimed is:

1. A display device comprising:
a circuit board having a pixel formed by a plurality of light emitting elements arranged thereon;
a driving circuit for driving the light emitting elements,
a case to which the circuit board and the driving circuit are to be arranged,
a frame disposed at a circuit board side of the case and having a flange to block external light from entering the light emitting elements, the frame being defining a through hole through which a screw can be inserted;
a shield disposed between the frame and the case to block electromagnetic noise; and
a screw inserted through the through hole defined in the frame,
wherein a screw receiving portion is provided in the case, the screw inserted through the through hole in the frame is placed into the screw receiving portion provided in the case to fix the frame with the case, and
wherein the screw receiving portion has a cylindrical metal portion to house the screw and to electrically connect the screw to the shield and a resin portion interposed between the placed screw and an inner wall of the cylindrical metal portion,
wherein the metal portion has a cut-out portion connecting from the inner wall surface of the metal portion to the side surface, and the resin portion and the case are connected by a resin which is a component of the resin portion and the case through the cut-out portion.

2. The display device according to claim 1, wherein a side surface of the metal portion has a projection and the projection and the resin portion forming the case are fit with each other in a projection-recess engagement form.

3. The display device according to claim 1, wherein a top of the metal portion protrudes further than a top of the resin portion of the screw receiving portion or the resin portion forming the case.

4. The display device according to claim 1, wherein the metal portion is electrically connected to a ground electrode disposed on a housing which is to fix the display device.

5. The display device according to claim 1, wherein the screw is a tapping screw.

6. A case for a display device comprising:
a circuit board having a pixel made of a plurality of light emitting elements arranged thereon;
a driving circuit to drive the light emitting elements;
a shield to block electromagnetic noise; and
a screw receiving portion capable of inserting a screw therein and formed in the case,
wherein a frame defining a through hole is disposed at the circuit board side of the case, a screw is inserted through the through hole and placed to the screw receiving portion so as to enable fixing of the frame and the case, and
wherein the screw receiving portion comprises a cylindrical metal portion housing the screw and electrically connected to the shield and a resin portion interposed between the placed screw and an inner surface of the cylindrical metal portion,
wherein the metal portion has a cut-out portion connecting from the inner wall surface of the metal portion to the side surface, and the resin portion and the case are connected by a resin which is a component of the resin portion and the case through the cut-out portion.

7. The case for a display device according to claim 6, wherein a side surface of the metal portion has a projection and the projection and the resin portion forming the case are fit with each other in a projection-recess engagement form.

8. The case for a display device according to claim 6, wherein a top of the metal portion protrudes further than a top of the resin portion of the screw receiving portion or the resin portion forming the case.

9. The case for a display device according to claim 6, wherein the metal portion is electrically connected to a ground electrode disposed on a housing which is to fix the display device.

10. The case for a display device according to claim 6, wherein the screw is a tapping screw.

11. A display device comprising:
- a circuit board having a pixel formed by a plurality of light emitting elements arranged thereon;
- a driving circuit for driving the light emitting elements,
- a case to which the circuit board and the driving circuit are to be arranged,
- a frame disposed at a circuit board side of the case and having a flange to block external light from entering the light emitting elements, the frame defining a through hole through which a screw can be inserted;
- a shield disposed between the frame and the case to block electromagnetic noise; and
- a screw inserted through the through hole defined in the frame,
- wherein a screw receiving portion is provided in the case, the screw inserted through the through hole in the frame is placed into the screw receiving portion provided in the case to fix the frame with the case, and
- wherein the screw receiving portion has a cylindrical metal portion to house the screw and to electrically connect the screw to the shield and a resin portion interposed between the placed screw and an inner wall of the cylindrical metal portion, and
- wherein the metal portion is electrically connected to a ground electrode disposed on a housing which is to fix the display device.

12. The display device according to claim 11, wherein a side surface of the metal portion has a projection and the projection and the resin portion forming the case are fit with each other in a projection-recess engagement form.

13. The display device according to claim 11, wherein a top of the metal portion protrudes further than a top of the resin portion of the screw receiving portion or the resin portion forming the case.

14. The display device according to claim 11, wherein the screw is a tapping screw.

15. A case for a display device comprising:
- a circuit board having a pixel made of a plurality of light emitting elements arranged thereon;
- a driving circuit to drive the light emitting elements;
- a shield to block electromagnetic noise; and
- a screw receiving portion capable of inserting a screw therein and formed in the case,
- wherein a frame defining a through hole is disposed at the circuit board side of the case, a screw is inserted through the through hole and placed to the screw receiving portion so as to enable fixing of the frame and the case, and
- wherein the screw receiving portion comprises a cylindrical metal portion housing the screw and electrically connected to the shield and a resin portion interposed between the placed screw and an inner surface of the cylindrical metal portion, and
- wherein the metal portion is electrically connected to a ground electrode disposed on a housing which is to fix the display device.

16. The case for a display device according to claim 15, wherein a side surface of the metal portion has a projection and the projection and the resin portion forming the case are fit with each other in a projection-recess engagement form.

17. The case for a display device according to claim 15, wherein a top of the metal portion protrudes further than a top of the resin portion of the screw receiving portion or the resin portion forming the case.

18. The case for a display device according to claim 15, wherein the screw is a tapping screw.

* * * * *